United States Patent [19]

Shimada et al.

[11] Patent Number: 5,691,787
[45] Date of Patent: Nov. 25, 1997

[54] ACTIVE MATRIX TYPE LCD HAVING SHORT RESISTORS MADE OF MICROCRYSTALLINE N+SI

[75] Inventors: Takayuki Shimada; Kazushige Miyamoto, both of Yamatokoriyama; Shinya Tanaka, Sakai; Naofumi Kondo, Ikoma, all of Japan

[73] Assignee: Sharp Kabushiki Kaisha, Osaka, Japan

[21] Appl. No.: 681,965

[22] Filed: Jul. 30, 1996

[30] Foreign Application Priority Data

Aug. 25, 1995 [JP] Japan ................................ 7-217983

[51] Int. Cl.$^6$ .................. G02F 1/1333; G02F 1/136; G02F 1/1343; H01L 29/04

[52] U.S. Cl. .................. 349/40; 349/42; 349/140; 257/59

[58] Field of Search .................. 349/40, 42, 140, 349/143; 257/59

[56] References Cited

U.S. PATENT DOCUMENTS

| | | | |
|---|---|---|---|
| 5,068,748 | 11/1991 | Ukai et al. | 349/40 |
| 5,200,876 | 4/1993 | Takeda et al. | 349/40 |
| 5,212,573 | 5/1993 | Yamazaki | 349/40 |
| 5,220,443 | 6/1993 | Noguchi | 349/40 |
| 5,504,348 | 4/1996 | Yoshida et al. | 349/42 |

FOREIGN PATENT DOCUMENTS 62-65455  3/1987  Japan .

*Primary Examiner*—William L. Sikes
*Assistant Examiner*—Toan Ton
*Attorney, Agent, or Firm*—Nixon & Vanderhye P.C.

[57] ABSTRACT

The active matrix type liquid crystal display device of this invention, includes: a first substrate including a plurality of gate signal lines, a plurality of source signal lines crossing the plurality of gate signal lines, a switching element provided in the vicinity of each crossed point of the plurality of gate signal lines and the plurality of source signal lines, and a pixel electrode connected to the switching element; a second substrate having a counter electrode; and a liquid crystal layer interposed between the first and second substrates, wherein at least the plurality of gate signal lines are connected to each other by short resistors made of microcrystalline n+Si.

8 Claims, 5 Drawing Sheets

1

ACTIVE MATRIX TYPE LCD HAVING SHORT RESISTORS MADE OF MICROCRYSTALLINE N+SI

BACKGROUND OF THE INVENTION

1. Field of the Invention

The present invention relates to a liquid crystal display device, particularly to an active matrix type liquid crystal display device being highly durable with respect to electrostatic voltage, and a method for fabricating the same.

2. Description of the Related Art

FIG. 7 schematically shows an example of a structure of an active matrix type liquid crystal display device 10 which uses thin film transistors (hereinafter referred to as TFTs) as switching elements. The liquid crystal display device 10 includes TFTs 2 arranged in a matrix and pixel capacitors 1 connected to drain electrodes of the TFTs 2. The pixel capacitor 1 includes a liquid crystal capacitor 1a formed by a pixel electrode, a counter electrode, and a liquid crystal layer interposed between the pixel electrode and the counter electrode, and a storage capacitor 1b provided in parallel to the liquid crystal capacitor 1a. The other end of the storage capacitor 1b is connected to a pixel capacitor line 4, and the other end of the liquid crystal capacitor 1a is connected to the counter electrode disposed on the counter substrate. A gate signal line 3 is connected to a gate electrode of the TFT 2 and a source signal line 5 is connected to a source electrode of the TFT 2. The TFT 2 is switched between the "on/off" states by a data signal provided to the gate signal line 3. When the TFT 2 is turned on, a video signal voltage supplied to the source electrode via the source signal line 5 is applied to the pixel capacitor 1.

A short ring (a short resistor) 6 is disposed between each of terminals 7 provided to the gate signal line 3 and the source signal line 5. The short ring 6 electrically connects the gate signal lines 3 to each other; the source signal lines 5 to each other; and connects the source signal lines 5 and the gate signal lines 3 to each other, thereby preventing the TFTs 2 from suffering damage by static electricity. Static electricity is generated during the assembling of the active matrix substrate (a substrate on which switching elements are provided), particularly during the process of mounting ICs for driving the LCD on the active matrix substrate, in the fabrication process of the liquid crystal display device.

In the above-described structure, when the short ring 6 is made of the material same as that for the gate signal lines 3 and the source signal lines 5, problems arise that the resistance of the short ring 6 is too low and the voltage of signal input into the TFT 2 via the gate signal line 3 and the source signal line 5 is affected, resulting in degrading the display quality. In order to apply a desired voltage to the TFTs 2 via the gate signal lines 3 and the source signal lines 5, it is required to set the resistance of the short ring 6 to be relatively high. For this reason, for example, Japanese Laid-Open Patent Publication No. 62-65455 discloses that the short ring 6 is made of n-type amorphous Si.

However, when the short ring 6 is made of n-type amorphous Si as in a conventional device, there is a problem that the electrostatic voltage durability is not sufficiently improved. The present inventors have studied this problem in detail, and obtained the following results: the resistivity of amorphous n+Si made by a Chemical Vapor Deposition (CVD) method is approximately 1 kΩcm, and the sheet resistance of a thin film having a thickness of 50 nm is about 200 MΩ. Accordingly, when a short ring having a length of approximately 100 μm is made of the amorphous n+Si, the resistance value (the resistance value at the intervals between the input signal lines adjacent each other) of the short ring 6 is several tens MΩ. This resistance value is too high to sufficiently discharge the electrostatic charges introduced into the panel. As a result, the electrostatic voltage durability is not sufficiently improved.

Moreover, when amorphous n+Si is used to make a short ring having sufficiently low resistance, there is a problem that the display quality is degraded. The present inventors have found that this is caused by the followings: the activation rate of phosphorus (P), which is an impurity implanted into an amorphous Si so as to form amorphous n+Si, is low. Accordingly, the variations of the processing conditions such as a film formation processing causes a large variation of the concentration of the P ions to be activated. As a result, there are some cases where a short ring having a resistance value lower than an average value by one digit or more may be formed. If a resistance value of the short ring is too low, a problem arises in that the level of voltage applied to the TFTs 2 via the gate signal lines or the source signal lines becomes lower than the desired level, resulting in display defects. Particularly, when the short ring formed at the intervals between the source signal lines 5 has a low resistance value, the level of voltage applied to the pixel capacitors 1 via the source signal lines 5 and the TFTs 2 fluctuates from the desired level, resulting in a nonuniform display.

SUMMARY OF THE INVENTION

The active matrix type liquid crystal display device of this invention includes: a first substrate including a plurality of gate signal lines, a plurality of source signal lines crossing the plurality of gate signal lines, a switching element provided in the vicinity of each crossed point of the plurality of gate signal lines and the plurality of source signal lines, and a pixel electrode connected to the switching element; a second substrate having a counter electrode; and a liquid crystal layer interposed between the first and second substrates, wherein at least the plurality of gate signal lines are connected to each other by short resistors made of microcrystalline n+Si.

In one embodiment of the invention, the short resistors connect only the gate signal lines adjacent each other among the plurality of gate signal lines.

In another embodiment of the invention, a resistance value of the short resistors is in the range between about 50 kΩ and about 3 MΩ.

In still another embodiment of the invention, the plurality of gate signal lines and the plurality of the source signal lines are connected to each other respectively by short resistors made of microcrystalline n+Si, and the short resistors connecting the plurality of source signal lines to each other have a resistance value of about 200 kΩ or more.

In still another embodiment of the invention, the switching element includes a gate electrode, a gate insulating layer, a semiconductor layer, a source electrode and a drain electrode made of microcrystalline n+Si; wherein each of the plurality of gate signal lines is connected to the gate electrode and is covered with the gate insulating layer, and each of the plurality of source signal lines is formed by a first conductive layer and is connected to the source electrode, and the pixel electrode is formed of a second conductive layer and is connected to the drain electrode; and wherein input terminals of the plurality of gate signal lines are covered with the gate insulating layer having a contact hole, and a third conductive layer is formed so as to cover at least a part of the contact hole, and the short resistors are formed so as to be in contact with the third conductive layer formed at the gate input terminals adjacent each other.

In still another embodiment of the invention, the third conductive layer is made of material same as that forming at least one of the first conductive layer and the second conductive layer.

A method for fabricating an active matrix type liquid crystal display device including a plurality of gate signal lines; a plurality of source signal lines crossing the plurality of gate signal lines; a switching element provided in the vicinity of each crossed point of the plurality of gate signal lines and the plurality of source signal lines; and a pixel electrode connected to the switching element, includes the steps of: forming the plurality of gate signal lines; forming an insulating layer covering the plurality of gate signal lines; forming contact holes at the insulating layer so that at least a part of input terminals of the plurality of gate signal lines are exposed; forming short resistors made of microcrystalline n+Si on portions of the insulating layer so as to correspond to the intervals between the plurality of gate signal lines; and forming a conductive layer covering at least a part of the contact holes and at least a part of the short resistors, so that the plurality of gate signal lines are electrically connected to each other via the short resistors.

In one embodiment of the invention, the conductive layer is formed by the layer identical to the conductive layer forming at least either the pixel electrode or the plurality of source signal lines.

Thus, the invention described herein makes possible the advantages of providing an active matrix type liquid crystal display device which has high durability to electrostatic voltage and provides an image having an excellent display quality; and a method for fabricating the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described with reference to the accompanying drawings.

Figure 1:
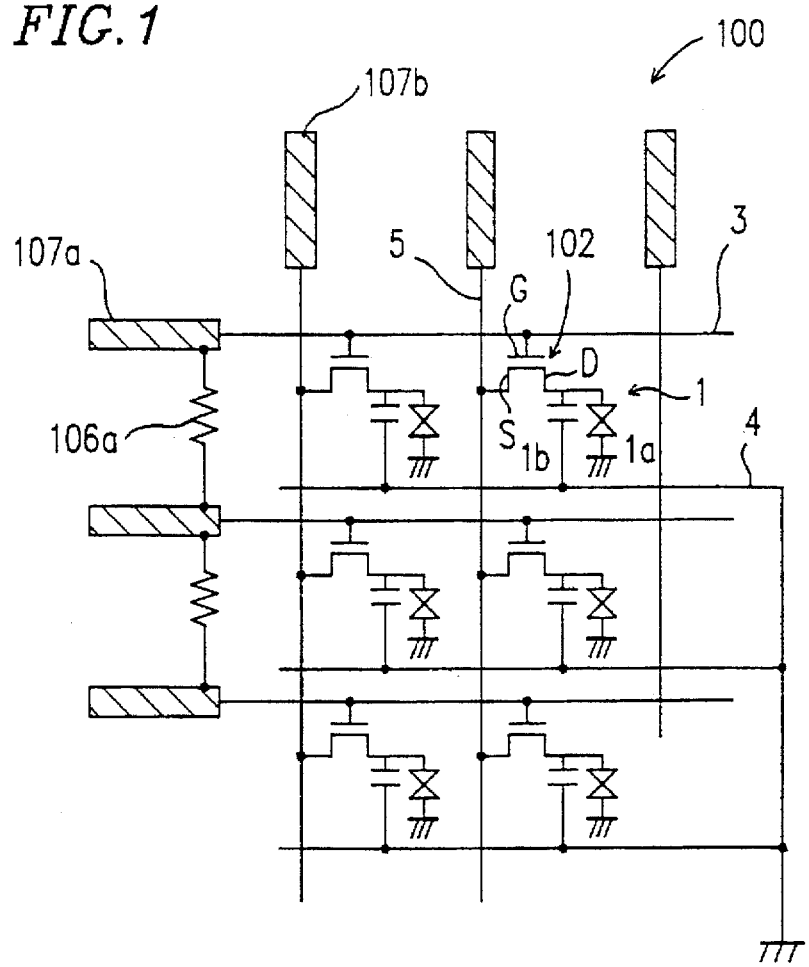
FIG. 1 is a plan view schematically showing a structure of an active matrix substrate of the present invention.

FIG. 1 shows a structure of an active matrix substrate 100 of the present invention. The active matrix substrate 100 includes a plurality of gate signal lines 3, a plurality of source signal lines 5 crossing the plurality of gate signal lines 3, and TFTs 102 provided in the vicinity of each crossed point of the gate signal lines 3 and the source signal lines 5. A gate electrode G of the TFT 102 is connected to the gate signal line 3 and a source electrode S of the TFT 102 is connected to the source signal line 5. A drain electrode D of the TFT 2 is connected to a pixel capacitor 1. The pixel capacitor 1 includes a liquid crystal capacitor 1a and a storage capacitor 1b. The liquid crystal capacitor 1a includes a pixel electrode, a counter electrode, and a liquid crystal layer interposed between the pixel electrode and the counter electrode. The storage capacitor 1b and the liquid crystal capacitor 1a are connected to each other in parallel. The storage capacitor 1b is provided so as to improve the charge holding characteristics of the liquid crystal capacitor 1a. Alternatively, the storage capacitor 1b may be omitted. One end of the storage capacitor 1b is connected to a pixel capacitor line 4, and one end of the liquid crystal capacitor 1a is connected to a counter electrode provided on the counter substrate.

The active matrix substrate 100 of the present example includes short resistors 106a disposed at the intervals between adjacent gate input terminals 107a of the gate signal lines 3.

Figure 2:
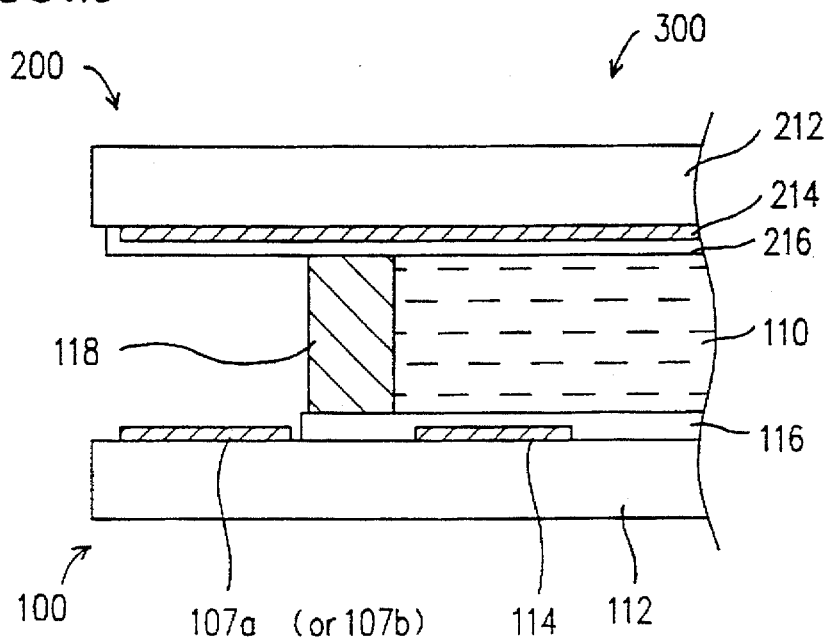
FIG. 2 is a cross-sectional view showing a structure of an active matrix type liquid crystal display device of the present invention.

An active matrix type liquid crystal display device 300 shown in FIG. 2 of the present example includes an active matrix substrate 100, a counter substrate 200, and a liquid crystal layer 110 interposed between the active matrix substrate 100 and the counter substrate 200. The active matrix substrate 100 includes a transparent substrate 112, TFTs disposed on the transparent substrate 112, gate signal lines, source signal lines, pixel electrodes 114, gate input terminals 107a, source input terminals 107b, short resistors, and an alignment film 116 so as to cover them. The counter substrate 200 includes a transparent substrate 212, a counter electrode 214 disposed on the transparent substrate 212, and an alignment film 216 so as to cover the counter electrode 214. The orientation of the liquid crystal molecules included in the liquid crystal layer 110 is controlled by the alignment films 116 and 216. The liquid crystal layer 110 is sealed in a gap between the active matrix substrate 100 and the counter substrate 200 by a sealing portion 118 made of a sealant. In the present example, the gate input terminals 107a, the source input terminals 107b, and short resistors 106a are formed outside of the sealing portion 118.

On the active matrix substrate 100 of the present example, no short resistor is provided to the intervals between the source input terminals 107b of the source signal lines 5, because sufficiently high electrostatic voltage durability can be obtained without a short resistor. The reason thereof will be described below.

The TFT 102 exhibits higher electrostatic voltage durability to the electrostatic charges provided through the source signal line 5 rather than to the electrostatic charges provided through the gate signal line 3. The resistance value Rgd between the gate and drain, and the resistance value Rgs between the gate and source are higher than the resistance value Rsd between the source and drain. Accordingly, the charge introduced into the gate electrode via the gate signal line 3 is stored in the capacitor Cgd between the gate and drain, and the capacitor Cgs between the gate and the source. Since the values of the capacitors Cgd and Cgs are small, a high voltage is applied between the gate and source or between the gate and drain. As a result, it is difficult to cause damage to the TFT with the charge. On the contrary, since the resistance value Rsd between the source and drain is relatively small, the charge introduced into the source signal line 5 flows into the pixel capacitor 1 having large capacitance. As a result, it is difficult to cause damage to the TFT with the charge. According to the experiments conducted by the present inventors, the rate of occurrence of defects in the case where the electrostatic charge is introduced into the source signal line 5 is lower by one digit than the case where the electrostatic charge is introduced into the gate signal line 3 (see FIG. 4).

In the present example, the short resistance 106a disposed at the interval between the terminals 107a is made of microcrystalline n+Si deposited by a Plasma Chemical Vapor Deposition (PCVD) method. In the present specification, n-type Si in which an impurity is doped at high concentration is referred to as n+Si. Moreover, in the present specification, microcrystalline silicon refers to an amorphous silicon containing about 15% or more of silicon crystals by volume. Moreover, the resistivity of the n+microcrystalline silicon used in the present invention is in the range between about 0.1 to about 10 Ω.cm. The formation of microcrystalline n+Si by a PCVD method is disclosed, for example, in the Japanese Laid-Open Patent Publication No. 2-275620. For example, microcrystalline n+Si can be formed by a PCVD method under the condition that the gas composition is $SiH_4/PH_3/H_2=1/1/50$ and the power density is about 0.5 W/cm$^2$. However, other conditions may be employed to make the microcrystalline n+Si used to form the short resistors of the present invention.

The resistivity of the microcrystalline n+Si obtained under the above-mentioned conditions is approximately 1 Ω.cm. This value is about 3 digits lower as compared with the amorphous n+Si of which resistivity is approximately 1 kΩ.cm. As a result, when the microcrystalline n+Si thin film is formed to have a thickness of about 50 nm, the sheet resistance of the n+Si thin film is approximately 200 kΩ. This makes it possible to obtain the resistance value between the terminals of several hundreds kΩ effective for preventing the damage due to the electrostatic charge.

Figure 4:
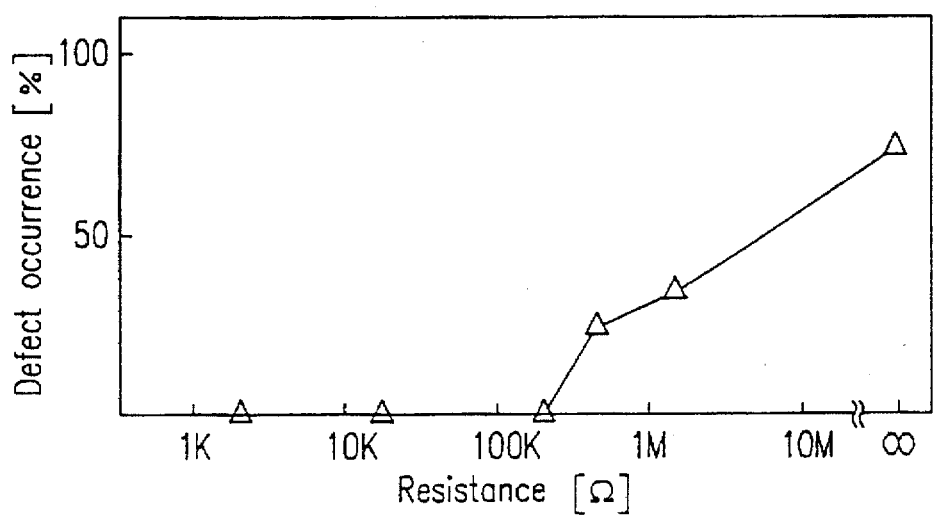
FIG. 4 is a graph illustrating the results of the evaluation on the relationship between the resistance value of the short resistors and the characteristics of the electrostatic voltage durability.

FIG. 4 is a graph illustrating the results obtained when the short resistors 106a having various resistance values are formed and the rate or occurrence of defects caused by the static electricity is obtained. The electrostatic voltage durability test is conducted under the condition that the gate signal lines are connected to the ground level (GND) via the short resistors. The electrostatic charge is supplied under the condition of 100 V, 200 pF, and 0Ω.

It is realized from the results shown in FIG. 4 that the defects begin to occur when the resistance value of the short resistors is about 300 kΩ or more, and the rate of occurrence of the defects exceeds 50% when the resistance value of the short resistors is about 3 MΩ or more. Therefore, in order to improve the electrostatic voltage durability, it is preferable that the resistance value of the short resistors is about 3 MΩ or less, and more preferable, about 300 kΩ or less. On the other hand, since resistance value of the short resistances that are too small affects the input waveform of the gate signal and causes display defects, it is preferable to set the resistance value of the short resistors to about 50 kΩ or more, taking the variation of the resistance value into consideration.

Figure 3:
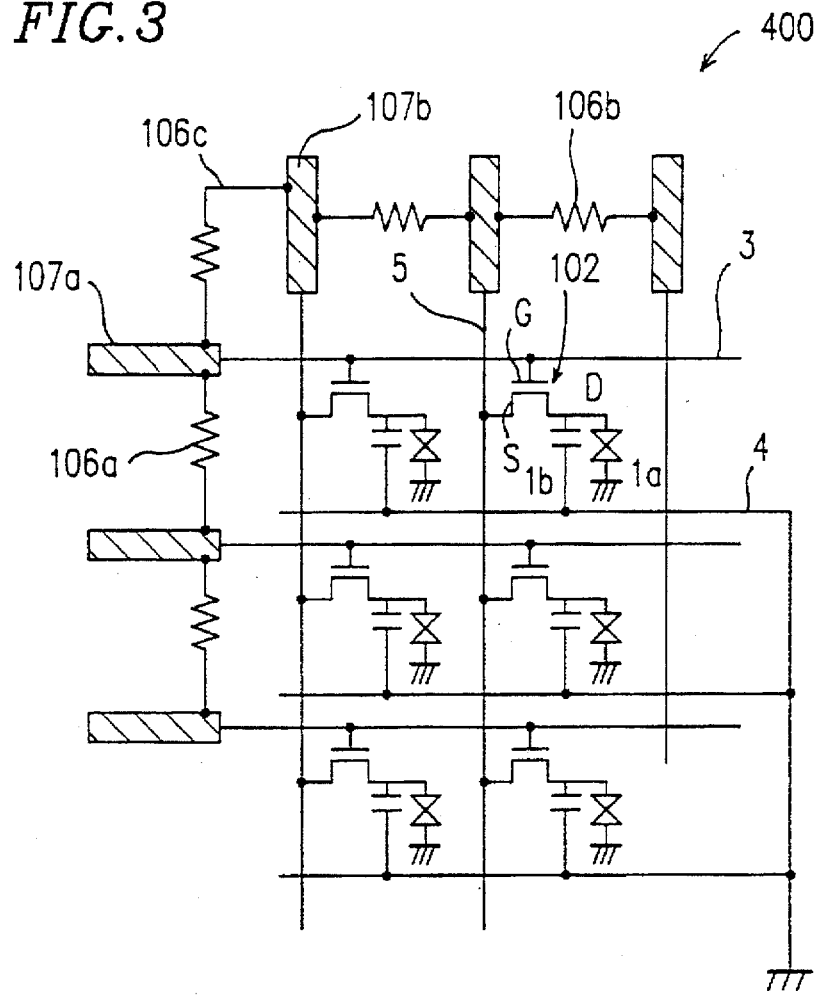
FIG. 3 is a plan view schematically showing another active matrix substrate of the present invention.

Next, an example of the case where short resistors 106b are disposed at the intervals between the source signal lines 5 in addition to the short resistors 106a disposed at the intervals between the gate signal lines 3. An active matrix substrate 400 shown in FIG. 3 includes short resistors 106a disposed at the intervals between adjacent gate input terminals 107a of the gate signal lines 3, short resistors 106b disposed at the intervals between adjacent source input terminals 107b of the source signal lines 5, and short resistors 106c disposed at the intervals between adjacent gate input terminal 107a and the source input terminal 107b. Accordingly, the active matrix substrate 400 has electrostatic voltage durability higher than that of the active matrix substrate 200. The resistance value of the short resistors 106b disposed at the intervals between the source signal lines 5 is preferably about 200 kΩ or more, and the variation thereof is preferably about 30% or less. The reason will be described below.

Whereas the gate signal supplied to the gate signal lines 3 is a digital signal used for turning on and off the TFTs 102, the source signal supplied to the source signal lines 5 is an analog signal used as a video signal. Accordingly, whereas the change in the level of the gate signal has an indirect influence on the display quality via the TFT characteristics, the change in the level of the source signal has a direct influence on the display quality. Therefore, in order to prevent the level of the source signal from deviating from the desired value, the resistance value of the short resistors 106b disposed at the intervals between the source signal lines 5 is preferably about 200 kΩ or more. Moreover, when the resistance value of the short resistors 106b disposed at the intervals between the source signal lines 5 is several hundreds kΩ and varies in accordance with the variation in the condition of the fabrication process, and the like, a problem arises that the display becomes nonuniform. For this reason, in the case where the short resistors 106b having a low resistance of several hundreds kΩ are disposed at the intervals between the source signal lines 5, the short resistors 106b are required to have a small variation in the resistance value.

When the short resistors 106b are made of amorphous n+Si as in a conventional device, the variation in the resistance value is large, resulting in seriously degrading the display quality. On the contrary, the short resistors 106b of the present example are made of microcrystalline n+Si, the variation in the resistance value of the short resistors 106b can be suppressed to approximately 30%. Accordingly, when the short resistors 106b having the resistance value of about 200 kΩ or more are formed by using the microcrystalline n+Si, and are then disposed at the intervals between the source signal lines 5, no problem of the degradation of the display quality arises during actual use. In addition, since a microcrystalline n+Si has a high value of the activation rate of impurities, there is only a small variation with respect to the lower resistance values. Accordingly, no problem of display defects arises caused by the resistance value of the short resistors 106b being too low.

Figure 5:
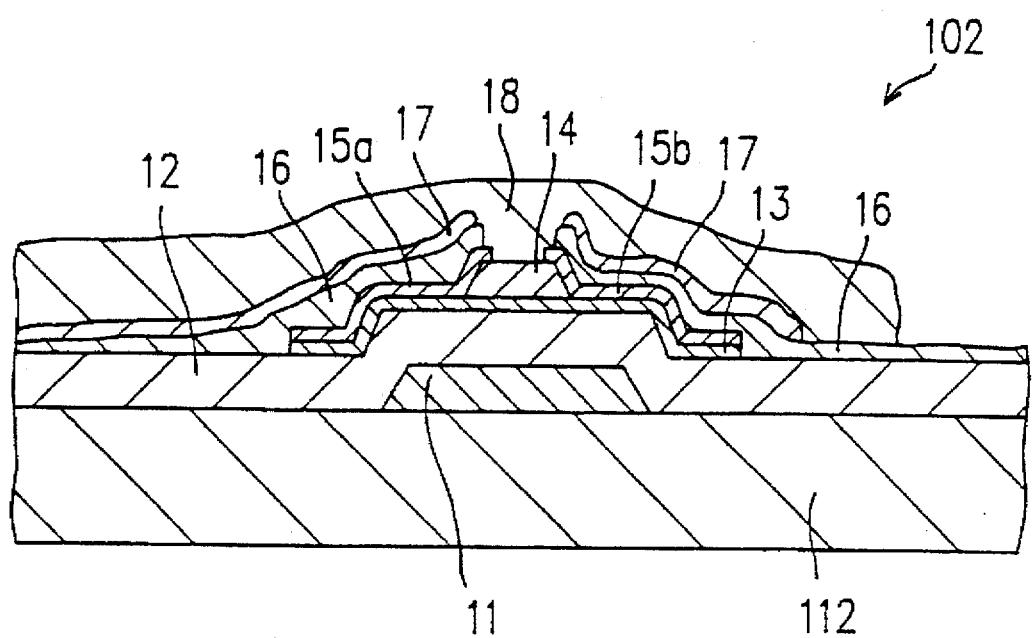
FIG. 5 is a cross-sectional view showing a structure of a TFT of an active matrix type liquid crystal display device of the present invention.

FIG. 5 is a cross-sectional view showing a structure of the TFT 102 provided to the active matrix substrate 100 of the present invention. The TFT 102 has a reverse staggered structure, and includes a gate electrode 11, a gate insulating layer 12, an amorphous or a polycrystalline silicon layer 13 which is a semiconductor layer of the transistor, a channel protective film 14, and a source electrode 15a and a drain electrode 15b formed by a microcrystalline n+Si layer, all of which are formed in this order above a transparent substrate 112. Furthermore, a transparent electrode layer 16 and a metallic layer 17 are formed on the source electrode 15a and the drain electrode 15b in this order. The transparent electrode layer 16 formed on the drain electrode 15b serves as a pixel electrode, and the metallic layer 17 formed on the source electrode 15a serves as a source signal line. The TFT 102 is covered with a protective film 18 formed by an insulating layer. As described above, since the source electrode 15a and the drain electrode 15b are made of microcrystalline n+Si, there is an advantage of improving the characteristics of transistor in the "on" state. Moreover, when the source electrodes 15a and the drain electrodes 15b are formed, the short resistors can be formed in the identical process simultaneously. As a result, the short resistors can be formed without increasing the number of fabrication process steps.

Figure 6A:
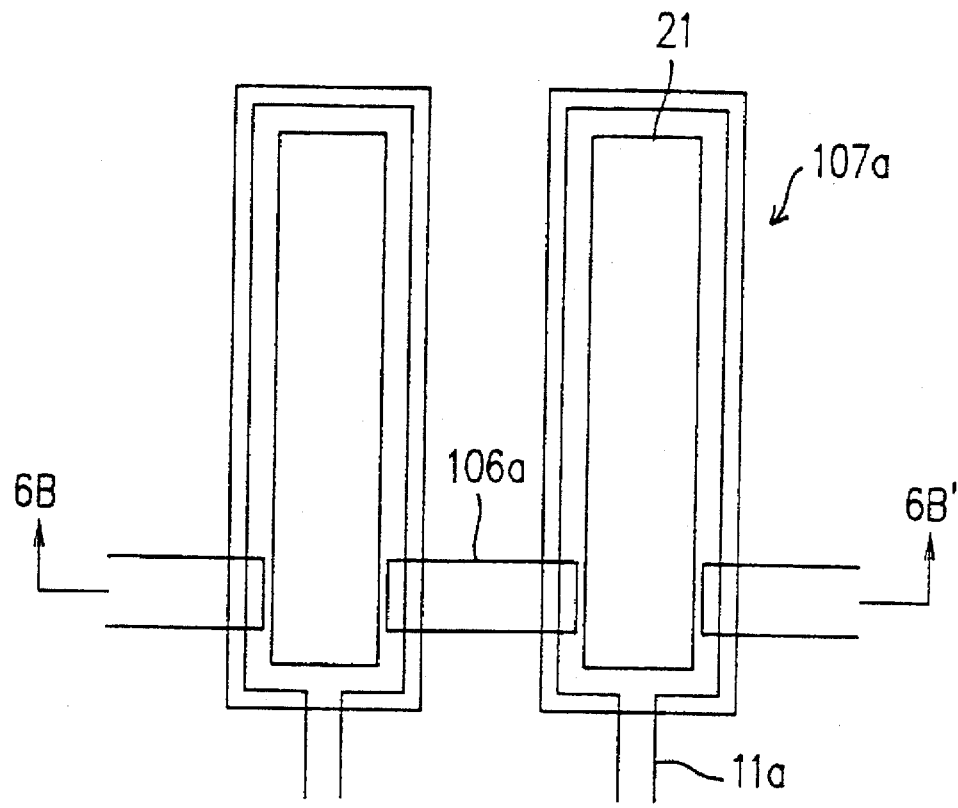
FIG. 6A is a plan view showing a structure of an input terminal of a gate signal line of an active matrix type liquid crystal display device of the present invention.
Figure 6B:
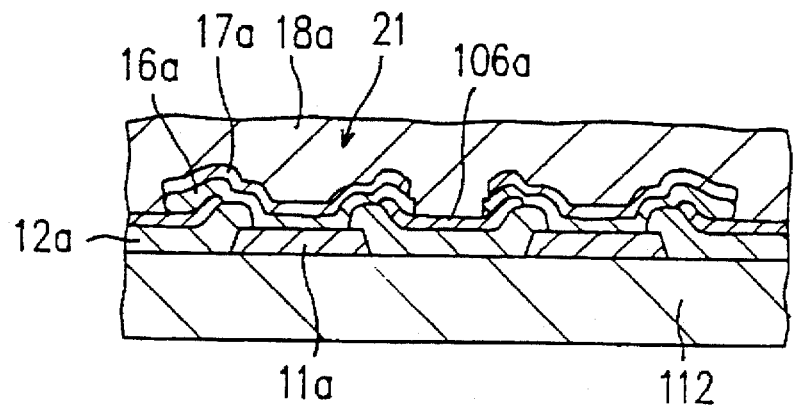
FIG. 6B is a cross-sectional view taken along line 6B—6B' of FIG. 6A.
Figure 7:
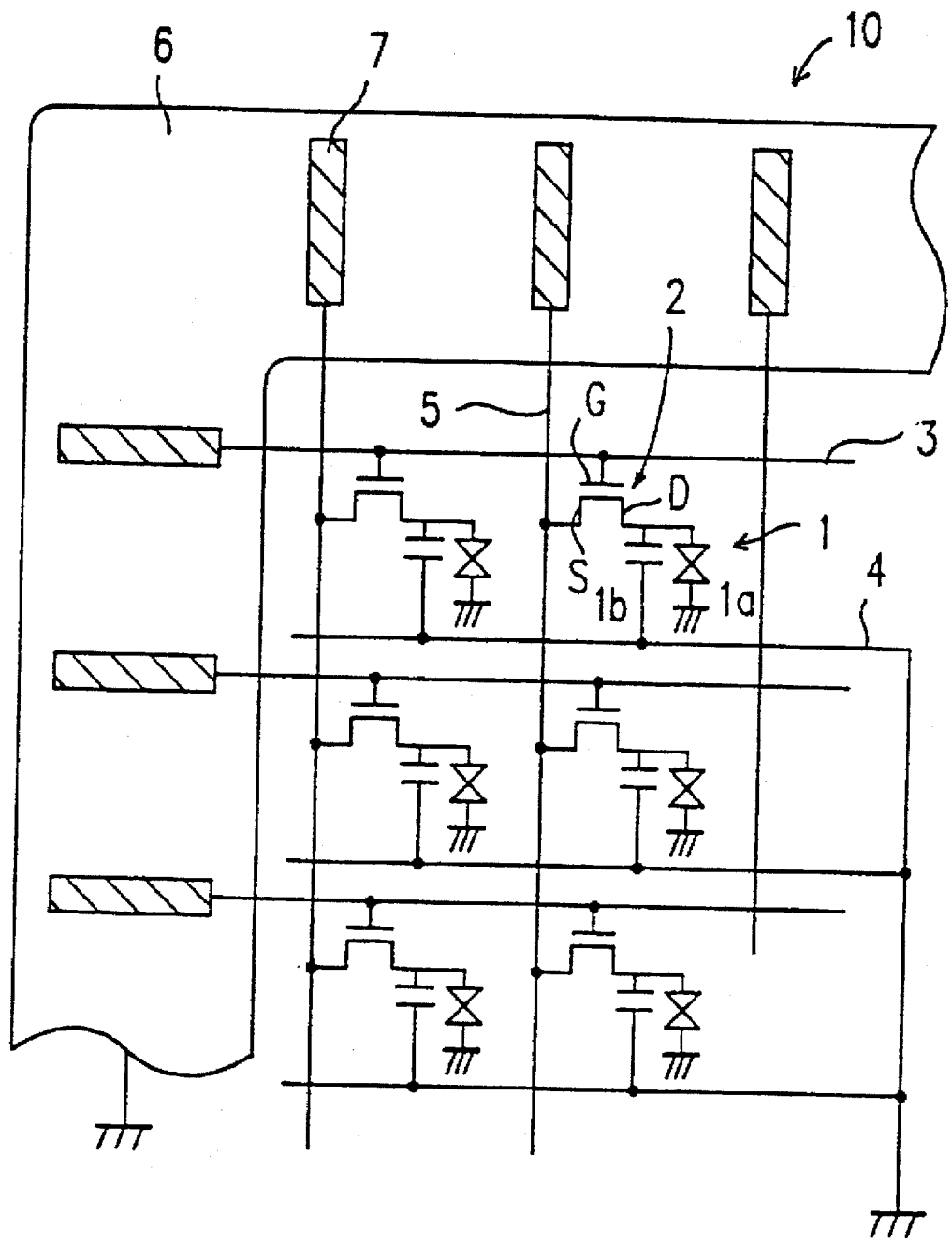
FIG. 7 is a plan view showing an example of a structure of a conventional active matrix substrate.

FIG. 6A is a plan view showing a structure of a gate input terminal provided with a short resistor, and FIG. 6B is a cross-sectional view showing a structure of a gate input terminal provided with a short resistor. An electrode 11a of the gate signal line and the gate input terminal 107a is formed by a metallic layer same as that forming the gate electrode 11. On the gate input terminal electrode 11a, an insulating film 12a made of the material same as that used for making the gate insulating film 12 is deposited, and a contact hole 21 penetrating the insulating film 12a is then formed. Next, on the insulating film 12a formed on the adjacent gate input terminal electrode 11a, a short resistor 106a is made of microcrystalline n+Si. Then, a transparent conductive layer 16a and a metallic layer 17a are formed so as to cover a part or the entire contact hole 21, so that the gate input terminal 11a and the short resistor 106a are electrically connected. In addition, the short resistor 106a, the transparent conductive layer 16a, and the metallic layer 17a are covered with a protective film 18a. In this example, both of the transparent conductive layer 16a and the metallic layer 17a are used to connect the short resistor 106a and the gate input terminal 11a. Alternatively, only one of them may be used. The formation of the above-described structure may be achieved by using a known thin-film technology.

In the present example, the interval between the gate input terminals 107a is about 60 μm, and a short resistor 106a made of microcrystalline n+Si having a width of about 50 μm is provided therebetween. The short resistor 106a has a resistance value of about 300 kΩ including a contact resistance with the transparent electrode layer. In order to form a short resistor 106a having the resistance of this value by using conventional amorphous n+Si, the short resistor 106a is required to have a width of about 50000 μm (which is 1000 times as large as that of microcrystalline n+Si). This is not preferable because the outer dimensions of the liquid crystal display device is also required to be enlarged accordingly. In the present example, it is possible to form a short resistor having a thickness of about 50 nm ±10 nm, a width of about 50 μm ±1 μm, and a resistance value of about 300 kΩ±20%, by using a microcrystalline n+Si.

As described above, in the present example, the short resistors 106a can be formed by using the material and the fabrication process same as those used for forming the TFTs 102. Accordingly, no process for forming the short resistors only is required, and therefore, there is no problem of increasing the production cost. However, the present invention is not limited to the above-described process, but the short resistors can be formed by employing the other process. Moreover, the short resistors 106a may be provided under the sealing portion which seals the liquid crystal layer, or alternatively, may be provided inside of the sealing portion (that is, on the liquid crystal layer side).

Furthermore, when the liquid crystal display device 100 having the short resistors 106a made of microcrystalline n+Si is operated, about 500 hours later, the resistance value of the short resistors 106a is increased by about 30% as compared with before the operation is started. When the liquid crystal display device is completed with the TFTs incorporated therein, there is only a small possibility that the TFTs suffer damage. Therefore, it is desirable that the short resistors have a high resistance value so as to suppress the variation in the signal level. Accordingly, it is preferable to form the short resistors by using materials which cause the increase in the resistance value of the liquid crystal display device during operation.

An active matrix type liquid crystal display device of the present invention includes the resistors made of microcrystalline n+Si disposed at least at intervals between the gate signal lines, thereby effectively discharging the electrostatic charge generated during the process of fabricating the active matrix substrate. Since the microcrystalline n+Si has a resistivity about 3 digits smaller than that of a conventional amorphous n+Si, it is possible to form resistors with a low resistance which effectively discharges the electrostatic charge. The resistance value of the resistors is preferably in the range between 50 kΩ and about 3 MΩ. The resistors of this value cause no problem that the level of the voltage applied to the TFTs via the gate signal lines deviates from the desired level.

Furthermore, the variation in resistivity of the microcrystalline n+Si is approximately 30%. This value. is small as compared with the case of using the amorphous n+Si. Accordingly, even if the resistors made of the microcrystalline n+Si are disposed at the intervals between the source signal lines, the degradation of the display quality is small. In this case, the TFTs have a relatively high durability to the electrostatic charge supplied from the source signal lines, so that it is sufficient for the resistors disposed at the intervals between the source signal lines to have a resistance value of about 200 kΩ or more so as to improve the electrostatic voltage durability. The resistors may be omitted from the intervals between the source signal lines.

Furthermore, the resistors and the source electrodes and the drain electrodes of the TFTs are made of microcrystalline n+Si, so that the resistors may be formed without increasing the number of fabrication processes of the active matrix substrate, and in addition, the transistor characteristics of the TFTs can be enhanced. Moreover, the resistors and the gate electrodes are electrically connected by using the conductive layer identical to the conductive layer forming the pixel electrodes or the source signal electrodes, so that the resistors can be formed without increasing the number of fabrication processes.

According to the present invention, an active matrix type liquid crystal display device which has a high electrostatic voltage durability and provides an image of excellent display quality, and a method for fabricating the same, can be provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An active matrix type liquid crystal display device comprising:
   a first substrate including a plurality of gate signal lines, a plurality of source signal lines crossing the plurality of gate signal lines, a switching element provided in the vicinity of each crossed point of the plurality of gate signal lines and the plurality of source signal lines, and a pixel electrode connected to the switching element;

a second substrate having a counter electrode; and a liquid crystal layer interposed between the first and second substrates, wherein at least the plurality of gate signal lines are connected to each other by short resistors made of microcrystalline n+Si.

2. An active matrix type liquid crystal display device according to claim 1, wherein the short resistors connect only the gate signal lines adjacent each other among the plurality of gate signal lines.

3. An active matrix type liquid crystal display device according to claim 1, wherein a resistance value of the short resistors is in the range between about 50 kΩ and about 3 MΩ.

4. An active matrix type liquid crystal display device according to claim 1, wherein the plurality of gate signal lines and the plurality of the source signal lines are connected to each other respectively by short resistors made of microcrystalline n+Si, and the short resistors connecting the plurality of source signal lines to each other have a resistance value of about 200 kΩ or more.

5. An active matrix type liquid crystal display device according to claim 1, wherein the switching element includes a gate electrode, a gate insulating layer, a semiconductor layer, a source electrode and a drain electrode made of microcrystalline n+Si;

wherein each of the plurality of gate signal lines is connected to the gate electrode and is covered with the gate insulating layer, and each of the plurality of source signal lines is formed by a first conductive layer and is connected to the source electrode, and the pixel electrode is formed of a second conductive layer and is connected to the drain electrode; and wherein input terminals of the plurality of gate signal lines are covered with the gate insulating layer having a contact hole, and a third conductive layer is formed so as to cover at least a part of the contact hole, and the short resistors are formed so as to be in contact with the third conductive layer formed at the gate input terminals adjacent each other.

6. An active matrix type liquid crystal display device according to claim 5, wherein the third conductive layer is made of material same as that forming at least one of the first conductive layer and the second conductive layer.

7. A method for fabricating an active matrix type liquid crystal display device including:

a plurality of gate signal lines;

a plurality of source signal lines crossing the plurality of gate signal lines;

a switching element provided in the vicinity of each crossed point of the plurality of gate signal lines and the plurality of source signal lines; and a pixel electrode connected to the switching element, the method comprising the steps of:

forming the plurality of gate signal lines;

forming an insulating layer covering the plurality of gate signal lines;

forming contact holes at the insulating layer so that at least a part of input terminals of the plurality of gate signal lines are exposed;

forming short resistors made of microcrystalline n+Si on portions of the insulating layer so as to correspond to the intervals between the plurality of gate signal lines; and forming a conductive layer covering at least a part of the contact holes and at least a part of the short resistors, so that the plurality of gate signal lines are electrically connected to each other via the short resistors.

8. A method for fabricating an active matrix liquid crystal display device according to claim 7, wherein the conductive layer is formed by a layer identical to a conductive layer forming at least either the pixel electrode or the plurality of source signal lines.

* * * * *